United States Patent [19]

Chamberlain

[11] Patent Number: 4,528,647
[45] Date of Patent: Jul. 9, 1985

[54] WAFER SCALE INTEGRATED CIRCUIT MEMORIES

[75] Inventor: John T. Chamberlain, Banknock, United Kingdom

[73] Assignee: Burroughs Corp., Detroit, Mich.

[21] Appl. No.: 316,016

[22] Filed: Oct. 28, 1981

[30] Foreign Application Priority Data

Jan. 7, 1981 [GB] United Kingdom ............... 8100350

[51] Int. Cl.³ ........................................... G11C 13/00
[52] U.S. Cl. ................................... 365/230; 364/900
[58] Field of Search ..................... 365/189, 201, 230; 371/21; 364/900

[56] References Cited

U.S. PATENT DOCUMENTS 3,475,733 10/1969 Gaines et al. .................... 365/49
4,037,205 7/1977 Edelberg et al. ................. 364/900
4,255,672 3/1981 Ohno et al. ...................... 307/455

FOREIGN PATENT DOCUMENTS 2311385 12/1976 France .
1337859 12/1974 United Kingdom .
1525048 9/1978 United Kingdom .

OTHER PUBLICATIONS

R. C. Aubusson et al., "Wafer-Scale Intergration, A Fault-Tolerant Procedure", I.E.E.E. Journal of Solid State Circuits, vol. SC-13, No. 3, Jun. 1978, pp. 339–344.
F. B. Manning, "An Approach to Highly-Integrated, Computer-Maintained Cellular Arrays", I.E.E.E. Transactions on Computers, vol. C-26, No. 6, Jun. 1977, pp. 536–552.
C. A. Finnila et al., "Associative Linear Array Processor", I.E.E.E. Transactions on Computers, vol. C-26, No. 2, Feb. 1977, pp. 112–125.
Y. Egawa et al., "A 1Mb Full Wafer MOS RAM", I.E.E.E. International Solid State Circuits Conference; Digest of Technical Papers, Feb. 1979, pp. 18–19.

Primary Examiner—Joseph A. Popek
Attorney, Agent, or Firm—Mark T. Starr; Edmund M. Chung; Kevin R. Peterson

[57] ABSTRACT

A data storage cell is provided for use when concatenated with similar cells in a wafer-scale integrated circuit as part of a serial memory chain. Data is stored in or retrieved from a shift register. A data switch is operable, dependently upon a selectable match criterion being met between the successive contents of a key word register and selectable sections of the data stored in register, the particular sections so selected being controlled by the contents of a control register. The access control is such that records are selectively stored in, or retrieved from, a particular cell dependent upon the content of the records themselves thus removing the necessity for keeping track of the position of records in the serial memory chain. The switch is selectably operable to provide a copy of the circulating contents of the data storage register as the signal on a data output line of the cell, so providing a means for non-destructive readout from the cell. The switch also provides the means of moving many data records along the serial memory chain simultaneously so that any desired ordering of the data records can be preserved during the insertion or deletion of individual data records.

16 Claims, 34 Drawing Figures

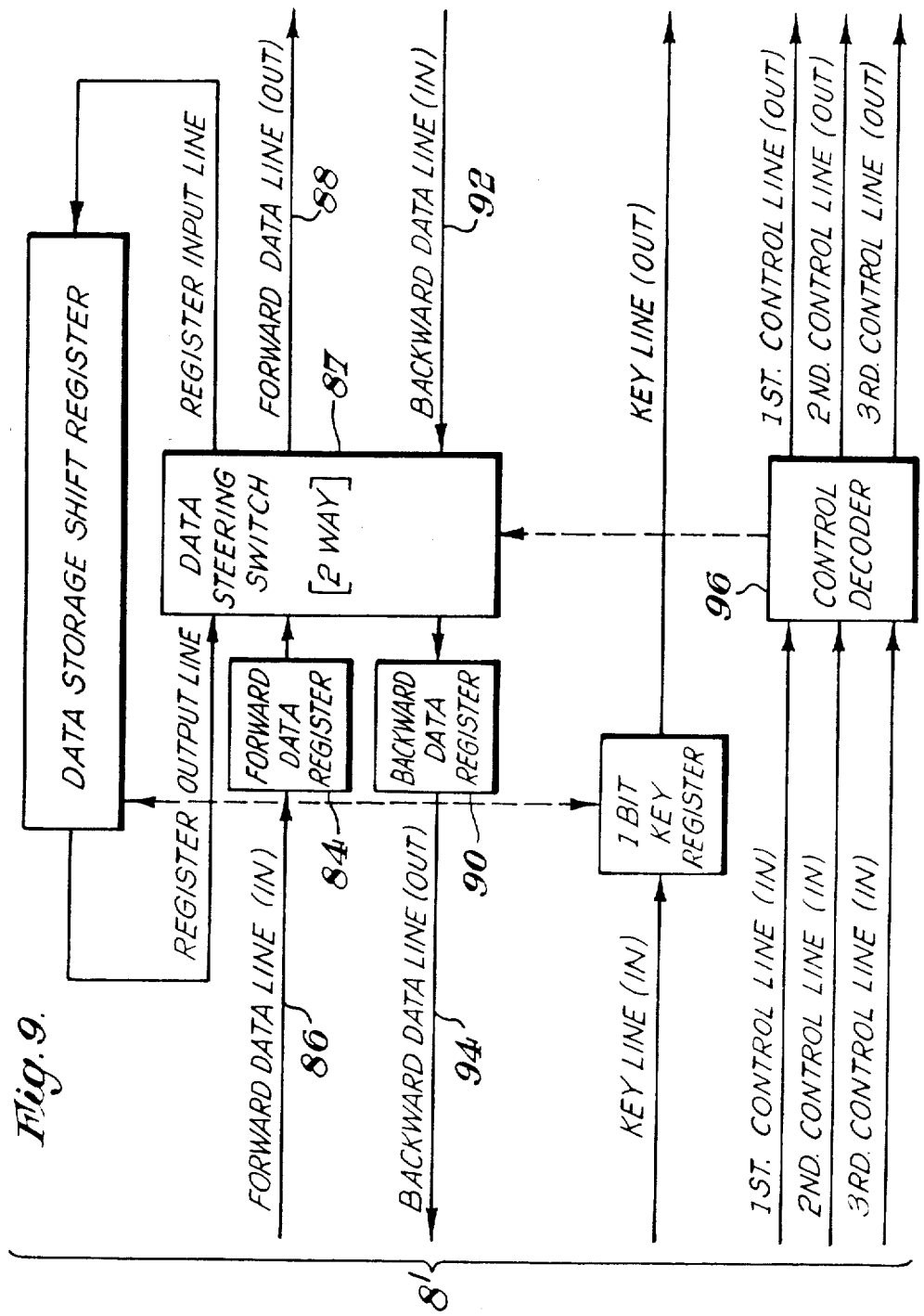

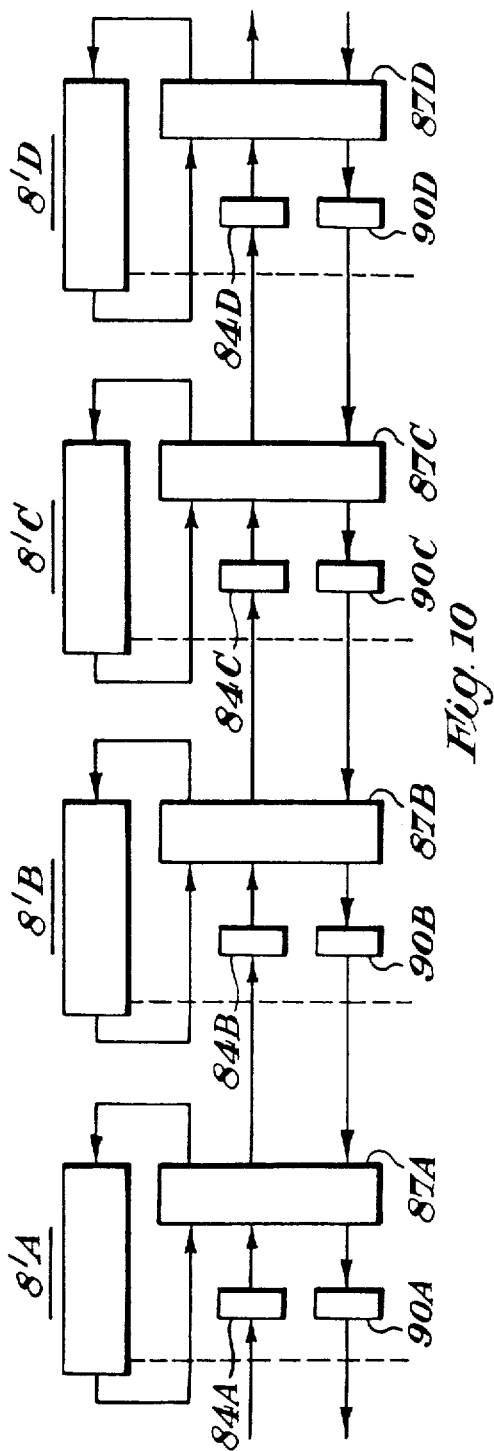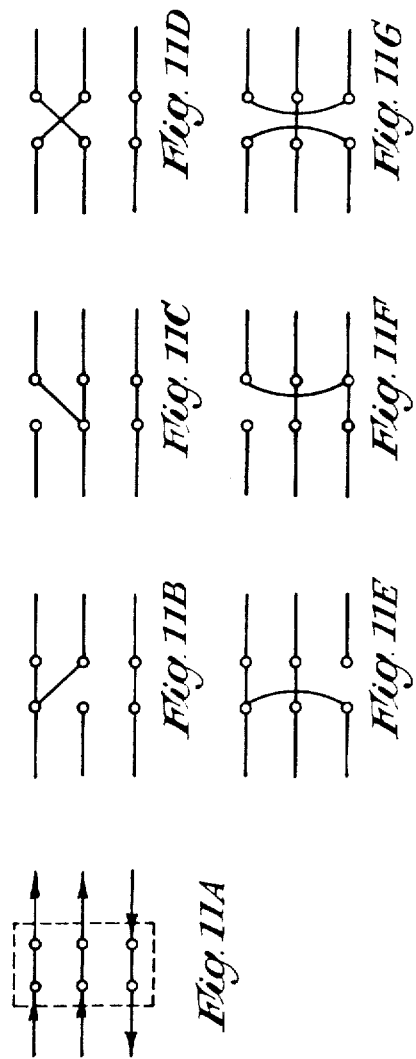

WAFER SCALE INTEGRATED CIRCUIT MEMORIES

BACKGROUND OF THE INVENTION

1. Field of the Invention

The present invention relates to wafer-scale integrated circuit memories.

2. Description of the Prior Art

A wafer scale integrated circuit is an integrated circuit which covers the entire area of a semiconducting wafer. The wafer is usually circular and is several inches in diameter. The circuit comprises one or more data ports whereby digital data and instructions can be passed into and/or out of the wafer. The circuit also generally comprises a plurality of data processing cells. The failure rate in circuit fabrications means that not all of the cells are necessarily functional. The cells are therefore testable. Starting at a port, a cell adjacently contiguous to that port is tested. If it passed the test it is coupled to the port for data transfer and can be used for data processing. If it does not pass the test another adjacently contiguous cell is chosen and tested. A cell which has passed the test can then behave as the port and test another adjacently contiguous cell. The end result of the testing routine is a chain or chains of tested, working cells starting at the port. Various forms for the chain are known in the art and others have been proposed. The exact form of chain connection is not part of the present invention.

It is known to use such wafer scale integrated circuit as a memory. The manner of memory storage can be in a continuous shift register loop starting and finishing at the the port. The data moves steadily between an input and an output terminal in the port. Individual data storage shift registers in the cells can be connected in series to provide a long, slow, data storage loop. Other shift registers of a much shorter length can be connected in parallel with the slow loop to form one or more fast, data access and/or data depositing lines. Data can be transferred between the fast and slow lines at a plurality of nodes, at least one in each cell. In this form of memory it is difficult to keep track of the position in the slow loop of any particular package of data. Complicated controllers are required to determine the node from which a data package can be recovered or inserted into the slow line. The control of the transfer requires additional control shift registers in parallel with the slow, data storage shift register chain.

The manner of data storage in such a memory can also be in a selectable storage shift register in a selectable cell, such shift registers not being connected in series. A data input line winds between the cells. This line carries an instruction or instructions destined for a specific cell. When the instruction reaches the cell, the cell responds by storing the data following the instruction or by retrieving data and returning it to the port via a data reply line which also winds among the cells. In such a memory it is also necessary to provide a controller for deciding where a particular piece of data is to be stored and for providing the instruction to retrieve a piece of data when that data is called for.

In general keeping track of data is a costly business requiring controllers, data processing software packages and the like. In addition, such memories may employ destructive readout whereby data is physically removed from its place or storage and required to be replaced if readout is not to be destructive.

It is therefore desirable to provide a wafer-scale integrated circuit memory wherein it is not necessary to provide separate means for keeping track of the location of stored data and wherein data recovery can be achieved in a non-destructive manner.

SUMMARY OF THE INVENTION

The present invention consists in a data storage cell comprising a data store and a through-passing data path, characterized by data being transferrable in any one out of a plurality of selectable manners between said store and said path in response to the contents of a selectable succession of locations in said store bearing any selectable one out of a plurality of magnitude relationships with a selectable address word.

BRIEF DESCRIPTIONS OF THE PREFERRED EMBODIMENTS

In a first preferred embodiment thereof a data storage cell comprises a data storage shift register whose output provides a first input to a data switch and a data transfer shift register whose output provides a second input to the switch. The data transfer register is preferably one bit long. The data storage register is preferably many bits long. The input to the data storage shift register is preferably provided by a first output of the switch. A second output of the switch is preferably provided as a data output coupling for the cell. The data transfer shift register preferably has its input coupled to a data input coupling provided to the cell. The switch is preferably selectably operable to couple the output of the data storage shift register to the input of the data storage shift register while simultaneously coupling the output of the data transfer shift register to the data output coupling of the cell, to couple the output of the data storage shift register to the data output coupling of the cell while simultaneously coupling the output of the data transfer shift register to the input of the data storage shift register, to couple the output of the data transfer shift register to the input of the data storage shift register while simultaneously coupling the output of the data transfer shift register to the data output coupling of the cell, and to couple the output of the data storage shift to the input of the data storage shift register while simultaneously providing a copy of the output of the data storage shift register as the data output coupling of the cell.

The data storage cell is preferably couplable as part of a chain of cells and the output of all registers therein, save as otherwise described, is preferably coupled as the input to a corresponding register in a successive cell in the chain and each register, save as otherwise described, is preferably in receipt of its input from the output of a corresponding register earlier in the chain. The chain is preferably conformable dependently upon each cell passing a functional test and the cells are preferably integrated circuit elements on a common semiconducting substrate, or wafer.

Each cell preferably comprises in addition a keyword shift register, preferably one bit long. The keyword register preferably receives a serial succession of binary digits some or all of which are to be matched against binary digits retrieved from the data storage shift register. The type of comparison to be made between the keyword register and the data storage shift register is selectably operable.

The cell also preferably comprises a control shift register, for receiving a preferably three bit wide parallel control word. The control register preferably includes a decoder for the control words.

The keyword register is preferably responsive to a particular control word or words to effect the comparison, that is, if so commanded by the control word, the particular bits currently present at the output of the data storage register and at the output of the keyword shift register are included in the overall comparison, but if not so commanded, those bits are not included in the comparison.

The keyword register is preferably responsive to command words in the control register to provide indication which is selectably indicative of equality between the binary number represented by the serial succession of binary digits presented as the output of the data storage shift register and the binary number passing through the keyword register, or of one number being greater than or lesser than the other number or of any combination of disparity in magnitude or equality.

The switch is preferably operable to take up a new configuration conditionally upon receiving a configuring command word from the control register and upon the selected match condition having been found by the keyword register.

In a second preferred embodiment all is as in the first preferred embodiment save that the cell has first and second data input and first and second data output couplings, data flowing in a first direction between the first input coupling and the first output coupling and in the opposite direction between the second input coupling and the second output coupling. The switch is also modified over that in the first preferred embodiment to selectably provide, conditionally upon the same criteria, but with an expanded range of commands for the control register to which it is responsive, the same coupling between the data storage shift register and the data transfer shift register and the first data input and output couplings but, in addition a coupling between the data storage shift register and the second data input and output couplings.

The invention is further explained, by way of an example, by the following description in conjunction with the appended drawings, in which: dr

BRIEF DESCRIPTION OF THE DRAWINGS

FIG. 9 shows, in schematic form, the second preferred embodiment.

FIG. 10 shows the cell of FIG. 9 concatenated with like cells to provide a serial memory chain.

FIGS. 11A to 11E show selectable configurations of the switch of FIG. 9.

DETAILED DESCRIPTION OF THE PREFERRED EMBODIMENTS

Figure 1:
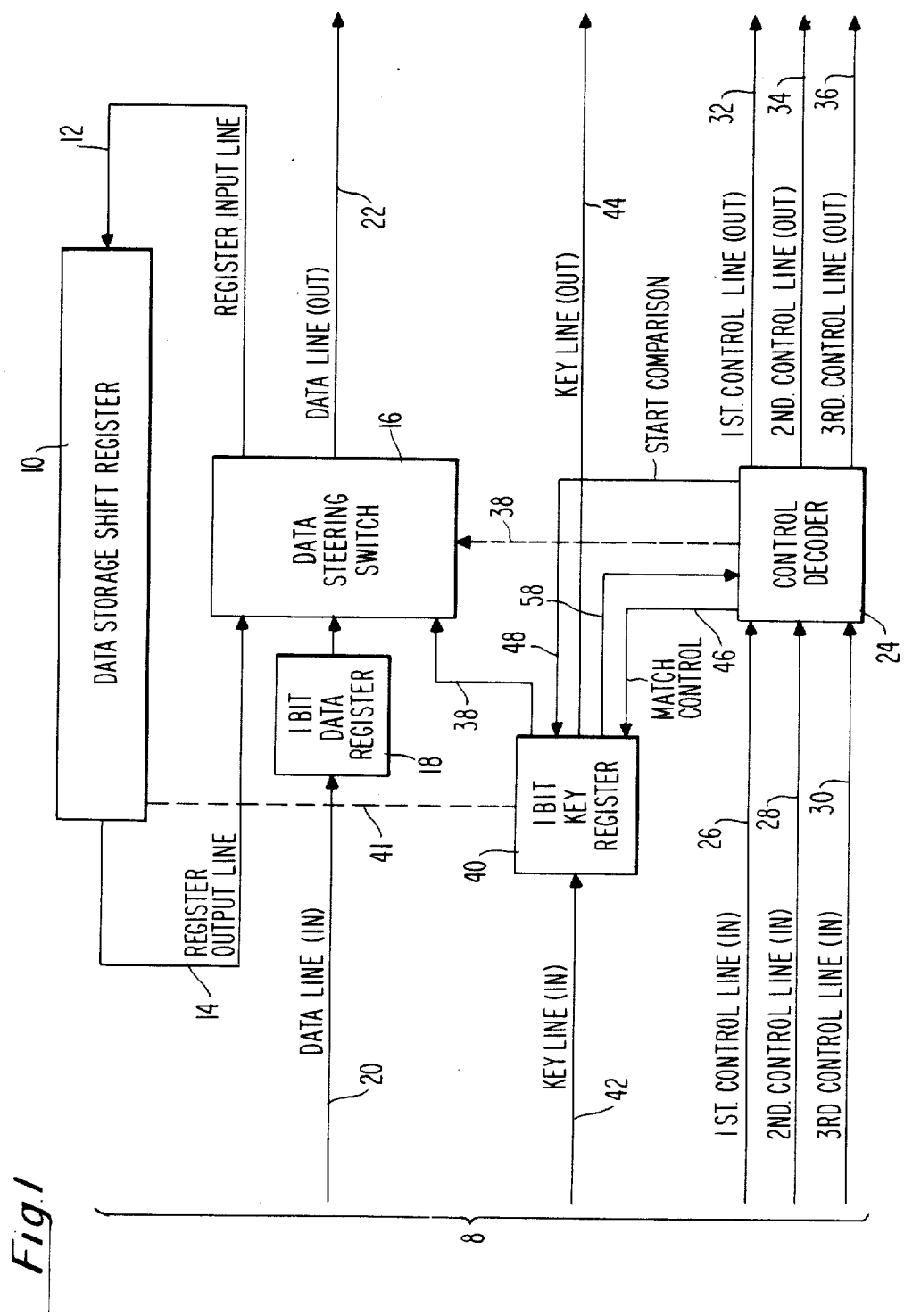
FIG. 1 shows a schematic diagram of the data storage cell of the first preferrred embodiment.

FIG. 1 shows the memory cell 8 of the first preferred embodiment of the present invention.

A data storage shift register 10 has data fed into its input from a register input line 12 and presents data at its output onto a register output line 14. The register output line 14 is provided as a first input to a data steering switch 16. The register input line 12 receives a first output signal from the switch 16. The output signal on the register input line 12 can be the signal received from the register 10 by the switch 16 on the register output line 14, so that data can be continuously recirculated in the register 10 via the switch 16. The switch 16 has other data steering functions, as will be explained.

The register 10 is preferably 1024 bits long, although it can be of any length. It is to be understood in the above description and in the following description that the memory cell 8 is in receipt of a global clock signal or signals, i.e. all memory cells 8 comprising the memory system receive the same clock signal or signals simultaneously, for controlling the shifting of data round the register 10 and for controlling the acceptance of data by latches, etc., in a manner which will become apparent. The manner of distribution of the clock signal or signals can be of any suitable kind.

The switch 16 receives the output of a data latch 18 as a second input. The data latch 18 receives its input signal from a data input line 20. When the register 18 is clocked, it provides on its output line 21 the logical state of the signal presented at its input, and persists in that output until clocked again. The switch 16 provides a second output signal on a data output line 22. The signal on the data output line 22 can be the output signal from the data latch 18 or from the register output line 14 depending on the mode of operation of the switch 16.

The operation of the switch 16 is controlled by a control decoder 24. The decoder 24 is in receipt of signals present on the first, second and third control input lines 26, 28, 30 respectively. The decoder 24 comprises latches for the signals on its three input lines 26, 28, 30. The outputs of the three latches are provided on first, second and third control output lines, 32, 34, 36 respectively. The latches are clocked together, and maintain their output until clocked again. The decoder 24 thus provides, as a a first set of outputs, the latched and, therefore, delayed signals on its inputs 26, 28, 30.

The decoder 24 is responsive to its latched input signals to provide control signals to the switch 16. The control signals to the switch 16 are provided via the switch control coupling 38. The latched input signals to the decoder 24 can thus control the action of the switch 16.

A one bit long key register 40 is clocked together with the storage register 10, the data register 18 and the control decoder 24, to receive and store, until next clocked, one bit of a keyword received on a key input line 42 and to provide its latched input signal on a key output line 44.

The key register 40 is in receipt of the data bit presented at the output of the data storage register 10 via the store bit line 41. The key register 40 compares the output bit of the data storage register 10 with its latched input bit. The comparison continues to take place over a number of successive bits as they are shifted through the key register 40 and data storage register 10 respectively. At the start of the comparison the key register 40 receives a comparison initializing signal from the decoder 24 via a start comparison line 48. The key register 40 then compares successive bits from the data storage register 10 via the store bit line 41 with successive bits on the key input line 42. The bits which are to be compared are dictated by the control words entering the decoder 24 in parallel on the first to third control lines 26, 28, 30. The bits which are compared act as an associative address for the data in the loop 10. The contents of the loop 10 form a data record. A number of bits of the record may constitute a name for that record. The name need not be a continuous block of bits, but may contain gaps in which data can appear. In particular, data sub-records can be identified within the record in the loop 10 by performing a comparison on the sub-record name therein. When a number of bits, or field, is to be compared, the word input to the control decoder commands the key register 40 to perform a comparison via the start comparison line 48. When a data bit appearing at the output of the loop 10 is for any reason not to be compared with the bit appearing on the key input line 42, the word input to the control decoder 24 indicates that the current field comparison is to be terminated. The result of the comparison is stored within control decoder 24 and further bit comparisons are ignored.

Figure 2A:
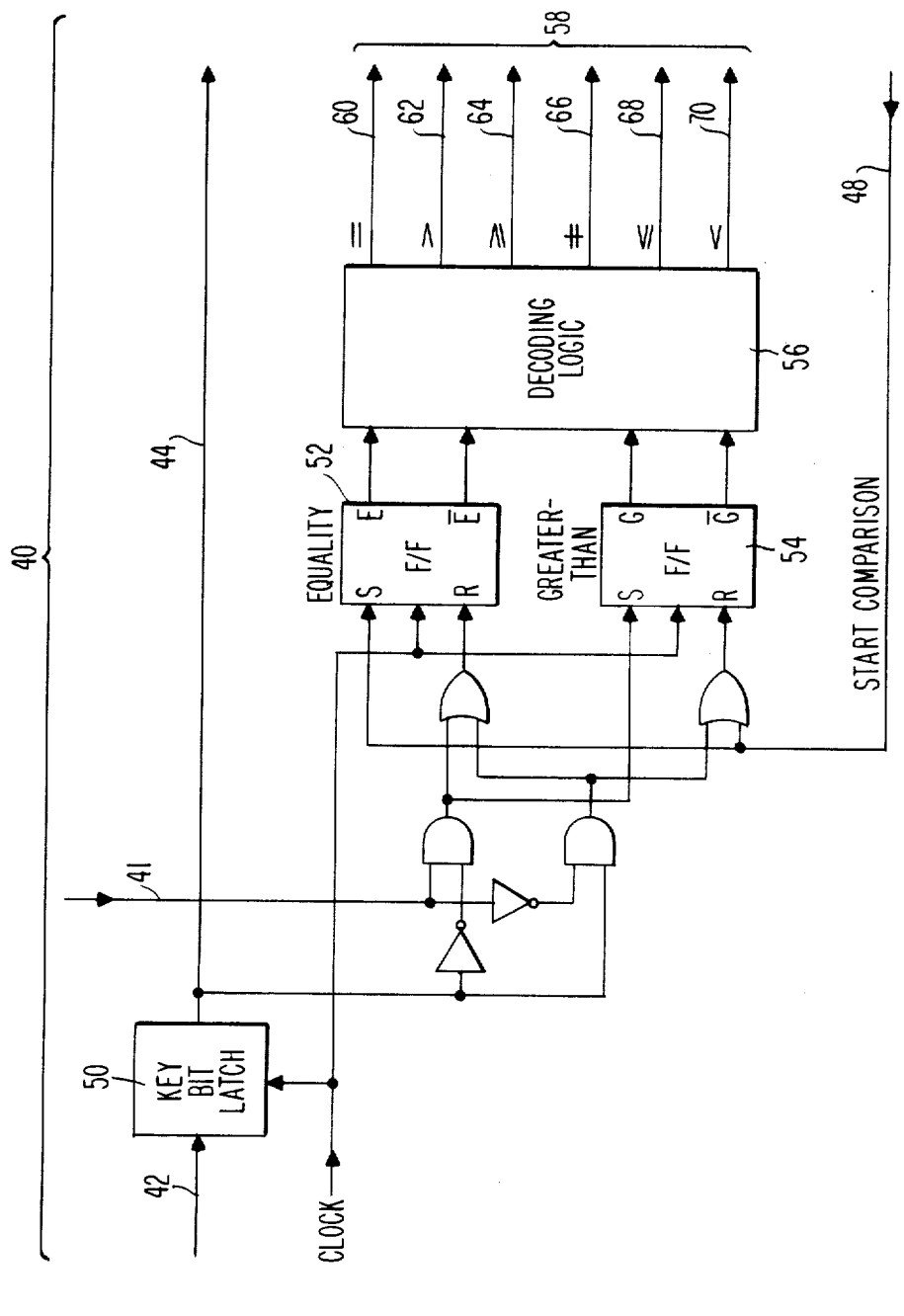
FIG. 2A shows, in schematic form, the embodiment of the key register of FIG. 1.

FIG. 2A shows a schematic drawing of the key register 40. The key register 40 can identify a comparison as one of three types. It can indicate whether the concatenated, comparison selected bits from the loop 10 constitute a binary word which is less than, equal to or greater than the succession of bits constituting the keyword received on the key input line 42 (and latched, by the key bit latch 50) since the key register received its initializing signal from the control decoder 24.

It is to be noted that only two of these comparison types require to be identified in order to know the third, since any number, if it is not in either of two of the conditions of being less than, equal to, or greater than another number, must be in the third condition relative to the other number.

In the particular case of the key register 40 of this embodiment the two conditions to be searched are those of equality, and of the binary word concatenated from the loop 10 being greater than the serial binary word presented at the key input line 42.

The key register 40 comprises a first equality flip-flop 52 and a second greater-than flip-flop 54. At the start of a comparison the state of the equality flip-flop 52 is set and the state of the greater-than flip-flop 54 is reset by the signal on the start comparison line 48 becoming logically true. Thereafter, provided that each pair of binary digits, one presented as the output of the loop 10 via the store bit line 41 and the other provided as the latched input to the key register 40 being the output of the key bit latch 50, match then the equality flip-flop 52 remains set indicating an equality match. If any such pair of binary digits does not match then the equality register is reset indicating that the binary word coming in on the key input line 52 and that presented as the output of the loop 10 are not equal.

In the preferred embodiment here shown it is arranged that the binary word stored in the loop 10 as a record name is presented to the output of the loop 10 least significant bit first. The output of the greater-than flip-flop 54 is set logically true whenever the binary digit presented as the output of the loop 10 via the store bit line 41 is logically true when the output of the key bit latch 50 is logically false. Conversely the output of the greater-than flip-flop 54 is set logically false whenever the store bit line 41 is logically false when the output of key bit latch 50 is logically true. The greater-than flip-flop 54 is thus set if the binary number concatenated from the contents of the loop 10 exceeds the corresponding binary number presented as the signal on the key input line 42.

The equality flip-flop 52 and the greater-than flip-flop 54 each provide true and inverted outputs as inputs to decoding logic 56. The logic 56 responds to its inputs by providing signals on an output coupling 58 the coupling comprising an equal line 60 whereon the signal is logically true provided that no inequality has been found between the loop 10 data word and the key line 42 keyword since the last comparison initialization, a greater than line 62 whereon the signal is logically true if the data word from loop 10 is greater than the contemporaneously presented keyword on the key input line 42, a greater-than-or-equal line 64 whereon the signal is logically true if the loop 10 data word and the key line 42 keyword are either equal or the data word is greater than the key word, a not-equal line 66 whereon the signal is logically true if the loop 10 data word and the key word are not equal, a less-than-or-equal line 68 whereon the signal is logically true if the data word is less than the key word or equal thereto, and less-than line 70 whereon the signal is logically true provided the data word is less than the keyword presented on the key line 42.

Returning to FIG. 1, the output coupling 58 of the key register 40 is provided as a controlling input to the data steering switch 16.

Figure 2B:
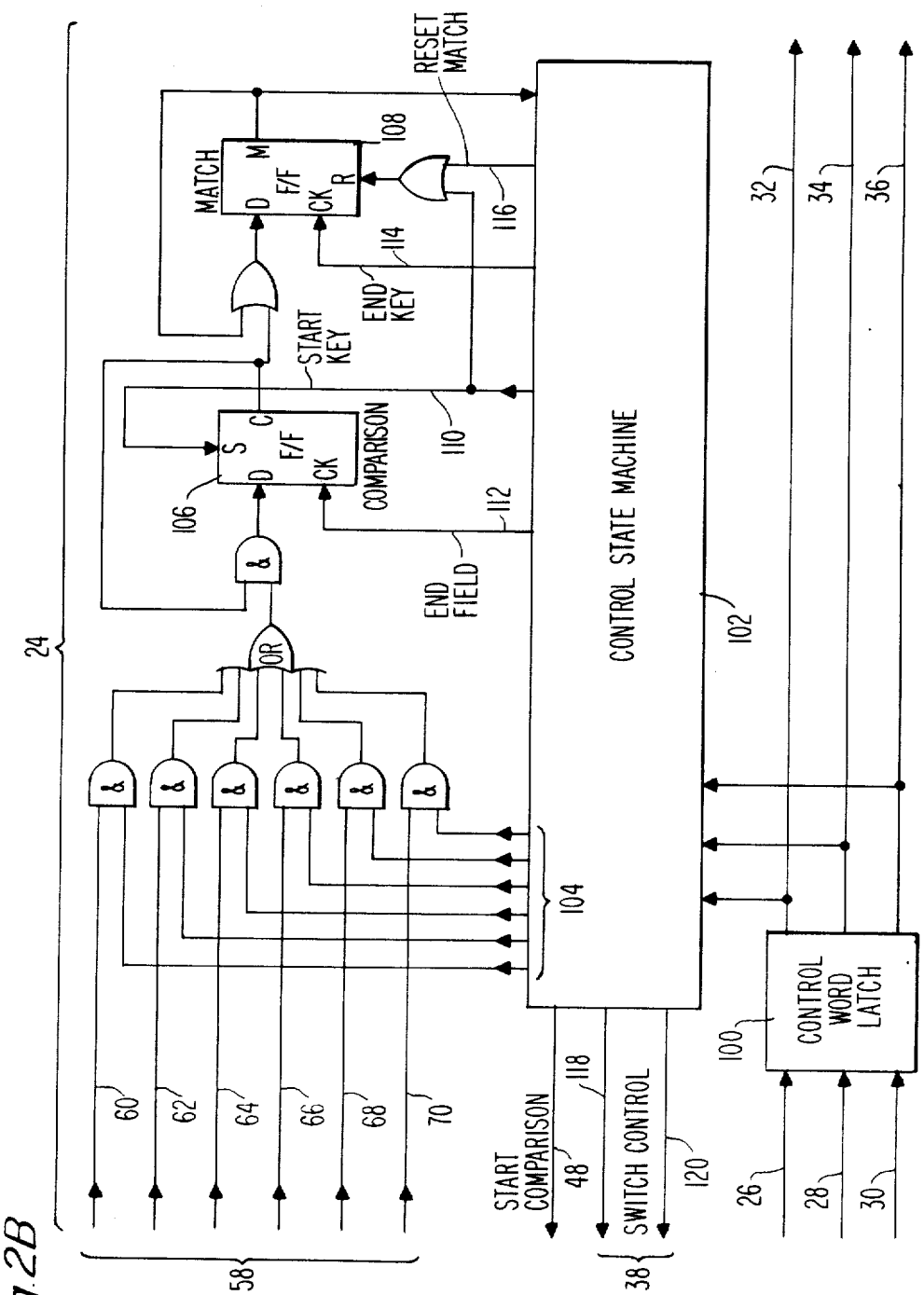
FIG. 2B shows, schematically, the preferred embodiment of the control decoder of FIG. 1.

FIG. 2B shows a schematic drawing of the control decoder 24. Input signals on the three control input lines 26, 28, 30 are latched in the 3-bit control word latch 100, the outputs of which are connected to the three control output lines 32, 34, 36 and also as controlling inputs to the control state machine 102.

The control state machine 102, under the direction of the control words successively received by latch 100, and of the state of the match flip-flop 108, as described below, generates output control signals to select the type of comparison to be made between the dataword in the associated storage loop 10 and one or more keywords input on key line 42, to selectively operate the data steering switch 16, and to determine the periods over which key comparisons and switch operations are to be effective.

Comparison of a particular field of the dataword is initiated by means of a signal generated on the start comparison line 48 to the key register as described previously. During the field comparison a logically true signal is placed on one of the six comparison selection lines 104 in order to select which type of comparison is to be made with the keyword. The logically true signal enables, one of the output coupling lines 58 from the key register 40 as input to the comparison flip-flop 106. The latter is set initially by means of the start key signal line 110 from the control state machine 102 and, at the end of each keyword field (defined by the appropriate control word input to latch 100 and state machine 102) its state is determined by the logical AND of its current state and the result of the field comparison as selected by one of the lines 104 from the input coupling 58. The new state is entered to flip-flop 106 by means of the end field line. Thus, at the completion of a comparison between the dataword and the keyword, the state of comparison flip-flop 106 represents the logical AND of all defined field comparisons within the length of that keyword.

Comparisons can be made between the dataword in loop 10 and a number of keywords presented sequentially by continuing to load the comparison flip-flop 106 for each defined field of the sequence of keywords. The state of the comparison flip-flop 106 then represents the logical AND of all the keyword comparisons. Alternatively the logical OR of successive keyword comparisons can be determined by employing the Match flip-flop 108 which is reset initially by a signal on the start key line 110, or by an explicit Reset Match signal on line 116 generated by the appropriate control word entered to latch 100. At the completion of a keyword comparison a signal on the end key line 114 loads the state of match flip-flop 108 as the logical OR of its current state and the state of comparison flip-flop 106 (representing the logical AND of the keyboard field comparisons). Note that the logical OR of a set of field comparisons can be formed by treating each field as a separate short keyword, generating appropriate Start Key and End key signals on lines 110 and 114 respective.

Provision of comparison and match flip-flops 106 and 108 enables complex selection operations to be performed on a set of datawords, those datawords satisfying the comparison criteria having their associated match flip-flops left in a set state. The state of the match flip-flop 108 is subsequently used to control the operation of switch 16 via control state machine 102, switch control lines 118 and 120, and control coupling 38. Depending upon the state of control lines 118 and 120, whether logically true or logically false, the switch 16 can adopt one of four operable positions in order to achieve a desired movement of data.

FIGS. 3A to 3D shows the manner of selectable operation of the switch 16.

Figure 3A:
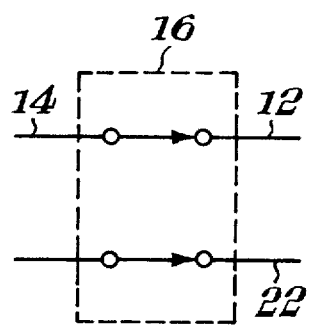
FIGS. 3A to 3D show selectable configurations of the switch of FIG. 1.

FIG. 3A shows the switch in a loop mode. The data stored in the storage register 10 loops therearound. The latched data from the data register 18 passes to the data output line 22.

Figure 3B:
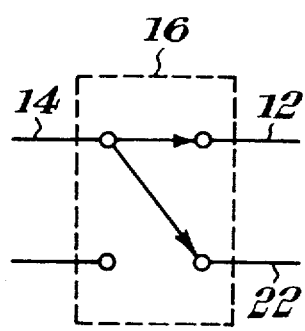

FIG. 3B shows the switch 16 in a copy mode. The data stored in the register 10 circulates therearound, while a copy thereof is provided on the data output line 22. The output from the data register 18 is not used. i.e. is discarded.

Figure 3C:
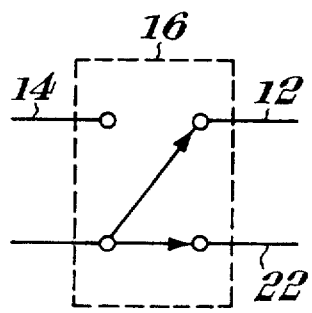

FIG. 3C shows the switch 16 in a data writing or overwrite mode. The data provided as the output of the data register 18 is coupled as the input to the storage loop 10. The output of the storage register 10 is discarded. The data in the register 10 is therefore changed for the new data coming in on the data input line 20. The output of the data register 18 is coupled as the signal on the data out line 22.

Figure 3D:
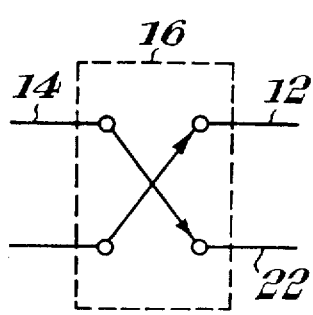

FIG. 3D shows the switch 16 in a so-called barrel mode. Data input on the data line 20 and provided, when clocked, as the output of the data register 18 is coupled as the input to the storage register 10, and the contents of the storage register 10, as they emerge therefrom, are coupled as the signal on the data out line 22.

Figure 4:
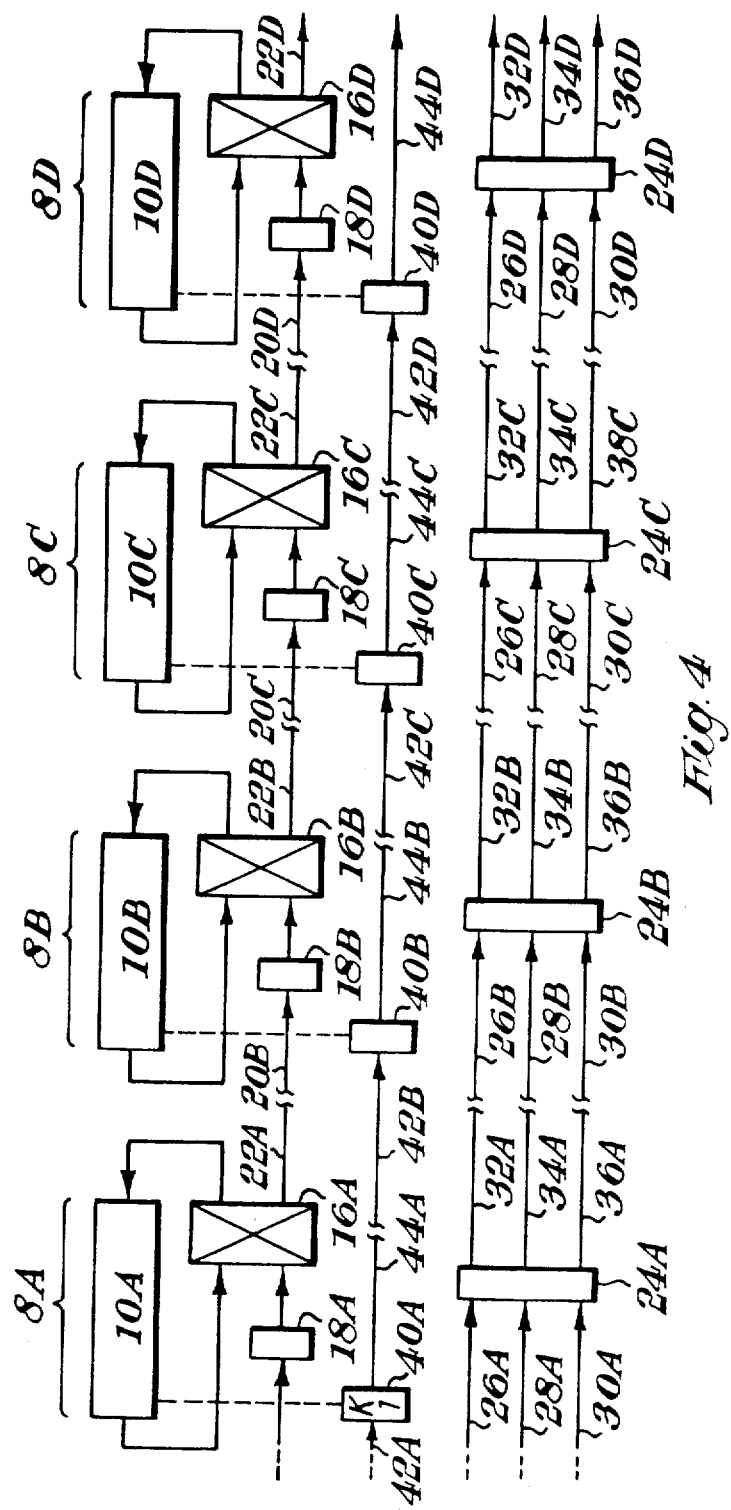
FIG. 4 shows the data storage cell of FIG. 1 concatenated with similar cells.

FIG. 4 shows the memory blocks as they would be concatenated in a wafer-scale integrated circuit.

Those skilled in the art will be aware of various well known and other proposed ways of coupling cells one to another in such memories. The number of memory blocks 8 in each cell will depend upon the chosen manner of coupling. In some chain memories, where cells are coupled one to another to form one or more unbranched chains starting at one or more ports, only one memory block is required in each cell. In other memories, where a branched chain or chains is or are formed from the port or ports, two, three or more such blocks will be required in a cell, the precise number being dependent upon the topology of both the teasellation of the cells and the internal logical configuration thereof. It is to be understood that any such memory cell will require to include directional signal couplers for coupling the signals in and out of the memory blocks in selected directions both across cell boundaries and within each cell. The present invention is not restricted to any particular inter-cell topology other than those where, after testing and forming of the wafer-scale integrated circuit, the individual memory blocks end up coupled in one or more chains as shown in FIG. 4. There are four memory blocks 8A, 8B, 8C, and 8D shown in FIG. 4, the alphabetical order of their suffixes being indicative of their position in the chain. The necessary directional couplers and associated circuitry between memory blocks are not shown in FIG. 4.

The data output line 22A, 22B, 22C, of each of the blocks 8A, 8B, 8C, is coupled to the data input line 20B, 20C, 20D of the following block. The key output line 44A, 44B, 44C, of each of the blocks 8A 8B, 8C is coupled to the key input line 42B, 42C, 42D of the next block in the chain. The control output lines 32, 34, 36 of each block 8A, 8B, 8C are coupled to the control input lines 26, 28, 30 of the successive blocks in the chain. The input signals to block 8A and output signals from block 8D, are likewise coupled to other blocks in the chain not shown in FIG. 4. When thus configured, data, keys, and commands can be passed from block to block down the chain. They all shift one place for each clock cycle. Similarly, the stored data in the storage registers 10A, 10B, 10C and 10D shift one place for each clock cycle. The clock can be distributed either globally by direct connection or according to other proposed schemes whereby the clock signal is passed from block to block along the chain. It is to be understood that the chain can extend as far to the left and right of FIG. 4 as is desired, the four blocks 8 shown being by way of limited example. Data records are input to the chain via data line 20, and hence to storage registers 10 in synchronism with an external record clock signal with a period equal to the rotation period of registers 10. Hence, records in successive storage registers will occupy bit positions one bit out of step with their neighbours because of the one-bit delay introduced by data register 18.

FIGS. 5A to 5D show, in greater detail, the manner of performance of the comparison operation described earlier.

Figure 5A:
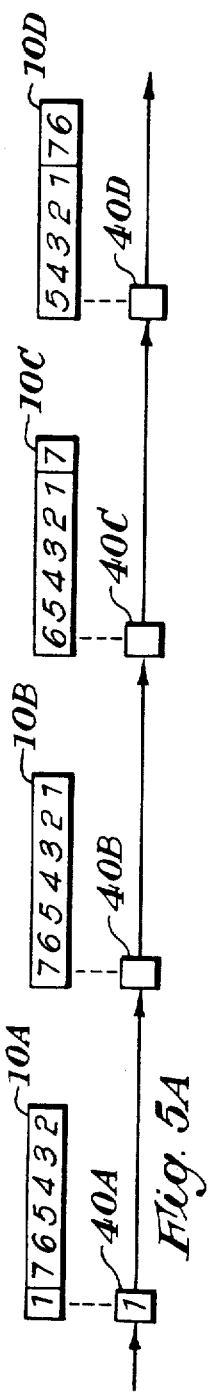
FIGS. 5A to 5D show successive stages in the matching process between a keyword and a part of a data record in the data storage shift register.

FIG. 5A shows the first bit of a keyword entering the key register 40A of the first memory block 8A. The numerals shown in each data storage register 10A, 10B, 10C, 10D are indicative of the bit number in the data record stored therein with reference to their location in the register 10. By way of example and clarity of drawing, the registers 10 have been shown as if they each contained only a seven bit record. It is to be understood that each register 10 contains many bits, in the case of the preferred embodiment there being 1024 such bits in each register. The bit marked 7 would, in that case be the 1024th or last bit in the register 10.

In FIG. 5A the first bit of the record in the first register 10A is in process of comparison with the first bit of the key word in the first key register 40A, and comparison has been enabled by entry of a control word to the associated control decoder 24, not shown in FIG. 5A. Comparison operations are not enabled currently between the data records in registers 10B, 10C, 10D and their respective key registers 40B, 40C, 40D.

Figure 5B:
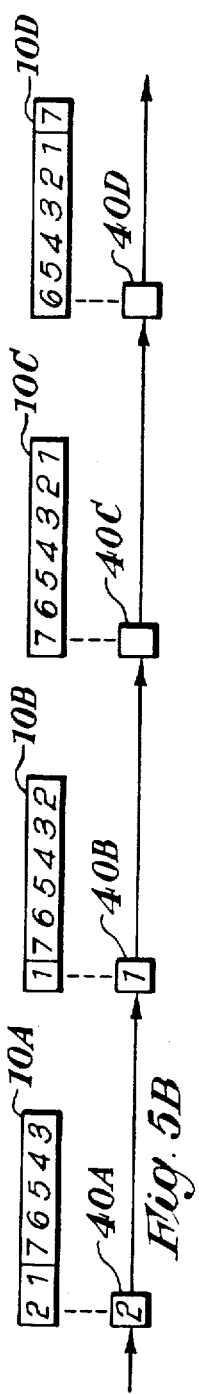

FIG. 5B shows the situation one clock cycle after the situation shown in FIG. 5A.

The records in each of the data storage registers 10A, 10B, 10C, 10D have all moved one place. At the same time the first binary digit of the key matching word has moved into the key register 40B of the second memory block 8B and the second binary digit of the key matching word has moved into the key register 40A of the first memory block 8A.

A comparison operation is now initialized and enabled between data storage register 10B and key register 40B and the first bit of the data record in register 10B is compared with the first bit of the keyword. Comparison also takes place between the second bit of the record in register 10A and the second bit of the keyword in key register 40A.

Figure 5C:
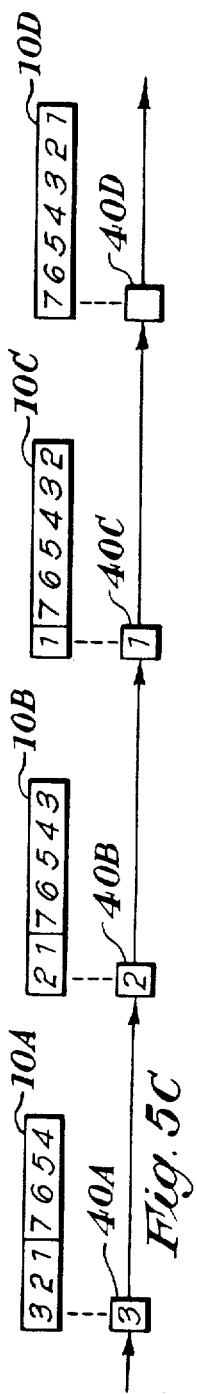

FIG. 5C shows the situation one clock cycle after the situation shown in FIG. 5B.

The records in each of the data storage registers 10A, 10B, 10C, 10D have each moved round one place as before, and the key matching word has moved one place along the chain of key registers 40A, 40B, 40C, 40D. The first bit of the key matching word is now compared with the first bit of the record in the third data storage register 10C, the second bit of the key matching word is compared with the second bit of the record in the second data storage register 10B, and the third bit of the key matching word is compared with the third bit of the record in the first data storage register 10A.

Figure 5D:
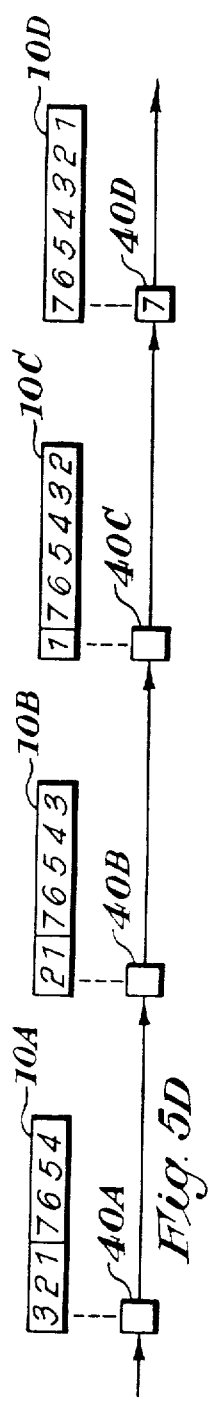

FIG. 5D shows the situation as the last bit of the key matching word passes through the key register 40D of the last memory block 8D. Though FIG. 5D shows this as the seventh bit, it is to be understood that the exact number of this bit is whatever the last bit happens to be. In the case of the preferred embodiment it is the 1024th bit, though the number can change dependently upon the length of the data storage registers 10. The last bit of the key word is matched, in the last memory block 8D against the last bit of the record in the last data storage register 10D. The key matching word is the same length as the records in the data stores 10 and the data records are assumed to exactly fill the stores 10. The key word, that is, the serial succession of binary digits moved along the chain of key registers 40 between memory blocks 8 is thus matched, bit for bit, against the records in the stores 10, the time of matching being one clock cycle later for each increment in position in the chain. The key word is thus first matched against the first record, one clock cycle later it begins to be matched against the second record, one clock cycle after that it begins to be matched aganst the third record, and so on until the key word has been matched against every record in the chain of memory blocks 8. It is seen in FIG. 5D that the first binary digit of the record in the penultimate memory cells 8C is once again presented for comparison to the penultimate key register 40C. The first key matching word can therefore be followed immediately by a second, and if required, further key words in order to perform selection operations of any desired complexity. Whenever a comparison operation is successful i.e. the dataword matches the logical combination of applied keyword fields, the associated match flip-flop 108 is set and is used subsequently to control operations of switch 16.

During the matching process described in FIGS. 5A to 5D it is to be understood that not every binary digit in the records on the stores 10 is matched against the key word. Fields for comparison are selected by means of control words entered to control decoder 24.

Returning to FIG. 4, it is seen that switching and comparison control words are propagated along the chain of control decoders 24 at the same time as the key word is propagated along the chain of key registers 40. Thus each bit of the key word may have associated therewith a control word. The associated control word moves from block 8 to block 8 along the chain with its key word bit. A bit in the key word can thus be designated as signifying the start or end of a field for comparison. A bit which is not for matching does not require to be of any particular logical polarity.

Control words to define the type of comparison for a particular field or to initiate or terminate a particular switching operation can be similarly synchronized with the proper bit position required.

TABLE 1

| | | | |
|---|---|---|---|
| 000 | NO-OP | | |
| 001 | START KEY | | |
| 010 | MASK KEY | | |
| 011 | END KEY | | |
| 100 | OPERATE | | |
| 101 | SET COMPARE MODE | | |
| | 000 NO-OP | | |
| | 001 = (DEFAULT MODE) | | |
| | 010 > | | |
| | 011 < | | |
| | 100 > or = to | | |
| | 101 < or = to | | |
| | 110 not = to | | |
| | 111 not used | | |
| 110 | PRESET OPERATION | | |
| | 000 NO-OP | 000 NO-OP | |
| | 001 ON FIRST MATCH ONLY | 001 RESET MATCH. | |
| | 010 UP-TO AND INCLUDING FIRST MATCH | 010 NO-OP | |
| | 011 NO-OP | 011 NO-OP | |
| | 100 UNCONDITIONAL | 100 LOOP | |
| | 101 FROM & INCLUDING FIRST MATCH | 101 COPY | |
| | 110 ALL MATCHES | 110 OVERWRITE | |
| | 111 NO-OP | 111 BARREL | |
| 111 | CONFIGURE | | |

The command decoder 24 of FIG. 1 is operable to receive its instructions from the control lines 26, 28, 30 in one, two, and three word blocks. Table 1 shows the instructions associated therewith.

The NO-OP command represents the normal idle condition of the control lines 26, 28, 30 and it has no effect on the current state of control decoder 24 nor upon any comparison or switching operation currently in progress.

The Start Key command is placed in the chain of control decoders 24 coincident with the beginning of a key matching word in the chain of key registers 40. It is this command word which sets the memory cell 8 to perform a key word to dataword comparison. The command designates the start of the first field of the keyword and activates a signal on start key line 110.

The Mask Key command is used to mark both the beginning and end of fields in the key word matching process. It is placed in the chain of control registers 24 coincident with the beginning of a field in the key word which is to be matched against the records in the storage loops (unless the field is the first field of a keyword in which case a start key command is used instead) and further placed in the control chain coincident with the last bit of the field to be examined. The Mask Key command thus defines which bits of loop 10 are to be matched. The command activates alternately signals on end field line 112 and start comparison line 48, under control of state machine 102, in order to mark the end and start of comparison fields respectively.

The End Key command is placed in the chain of control decoders 24 coincident with the last bit of the last field of the keyword in the chain of key registers 40 which is to be compared with the data records in loops 10. It replaces the Mask Key command which would otherwise be so placed. It disables the comparison between the key and the stored data, activating first and end field line 112 to transfer the result of the comparison to the comparison flip-flop 106, and then the end key line 114 to set the match flip-flop 108 appropriately.

The operate command is placed in the chain of control decoders 24 in synchronism with the external record clock, and at each storage location, that is, at each storate loop, relative to one or more set Match flip-flops 108, it sets the switch to a previously defined configuration enabling the input, output or movement of data records which have fulfilled the keyword comparison criteria. The command is also used to reset the match flip-flop 108 via reset match line 116 at any time subsequent to it having been set by an End Key command. In this case the operate command need not be synchronized to the external record clock.

The Set Compare Mode command is placed in the chain of control decoders 24 at any point coincident with an enabled comparison field and before the Mask Key command marking the end of that field. This Set Compare Mode command is always followed by a parameter defining for which of the various relationships between the dataword stored in the data storage register 10 and the key word fed serially into the chain of key registers 40 a match will be deemed to have been found. If the Set Compare Mode command is not so provided the comparison relationship is set to be equality by default. Once a comparison mode is set it remains thus for all subsequent fields. Alternatively, a new Set Compare Mode command can be provided for each field in a stored record and the criterion for match is thus made variable along a record. The direct effect of a Set Compare Mode Command input to state machine 102 is to apply a logically true signal on one of the comparison selection lines 104 appropriate to the command parameter. The parameters of the Set Compare Mode command are also shown in table 1. The parameters are self explanatory. If a NO-OP parameter is so provided the command as a whole is totally ignored.

The present operation command is a two-parameter command placed in the chain of control decoders 24 at any time after an End Key Command. This command must occur before an Operate command, or the Operate Command will be ignored. The Preset Operation command sets up the switch configuration to be taken up at each storage loop relative to one or more set match flip-flops 108 upon receipt of the subsequent operate command, or sets up which of any previously set match flip-flops are to be reset. The first command parameter following the preset operation command proper determines how the command is to be interpreted in relationship to the set match flip-flops 108. If a NO-OP is sent as the parameter the command is totally ignored. If an "on first match only" first parameter is received the command is ignored at all storage loop locations where no Match flip-flop 108 has been set. When a memory block 8 is reached where a match flip-flop is set the state machine 102 records the configuration to which the switch 16 is to be set, or whether the Match flip-flop is to be reset, as defined by the subsequent second parameter, and the "on first match only" parameter is changed into a "NO-OP" parameter by control decoder 24 for transmission to subsequent memory blocks. The "set on first match" command thus arranges that only one of the switches 16 will be activated the particular switch activated is that one in the first cell in the chain where a match is found. If "up to and including first match" is provided as the first parameter the state machine 102 will record the action to be performed, as subsequently defined by the second parameter, in all cells in the chain from the start up to and including that memory block where a match is first found according to whatever matching criterion is employed. The parameter will then be changed to NO-OP. If an "unconditional" first parameter is provided then the specified action as defined by the subsequent second parameter will be present regardless of the state of the Match flip-flop in all memory blocks. If "from and including first match" is provided as the first parameter, the specified action as defined by the subsequent second parameter will be performed by all those cells in the chain starting with the first memory block where a match is found and ending with the last memory block in the chain. If "unconditional" is provided as the first parameter all memory blocks perform the action defined by the second parameter. If "all matches" is provided as the first parameter the preset action is recorded in all memory blocks in the chain where a match is found. The specified preset action is executed by a Subsequent Operate command.

Table 1 also shows the allowable second parameter values for the Preset Operation command. A NO-OP parameter causes the complete command to be ignored. The other parameter types are self explanatory. The exact manner of the response to switch configuration commands is given in the earlier description associated with FIG. 3.

The configure command is used to control the progression of the testing and chain connection of the wafer-scale integrated circuit. It can be followed by numerous parameters for particular control thereof. The exact nature of the control is not of interest to the description of the present invention, it being mentioned purely as an illustration that the control decoder 24 can be used otherwise than as earlier described during other phases of operation of each memory block 8.

It will be apparent to those skilled in the art how the command decoder 24, and the switch 16 can be constructed in order to comply with the foregoing description. Other particular command structures can be implemented within the scope of the present invention.

FIGS. 6A to 6D show how the chain of memory blocks 8 can respond to some of the commands cited in table 1.

Figure 6A:
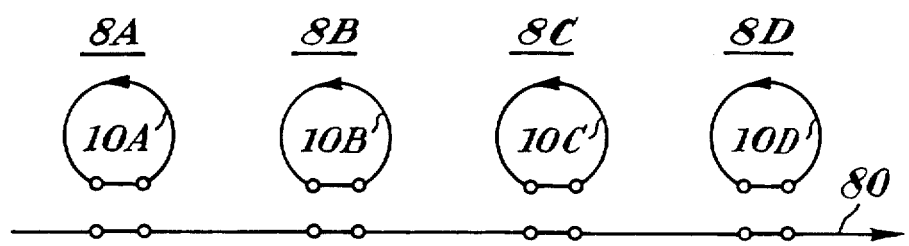
FIGS. 6A to 6D show, schematically, various data flow configurations which can be selected.

FIG. 6A shows each of the memory blocks 8 circulating the stored data in its storage loop 10 in response to a sequence of commands unconditionally setting all switches 16 to loop. The data stream does not interact with any data store 10 in its passage down the data chain 80.

Figure 6B:
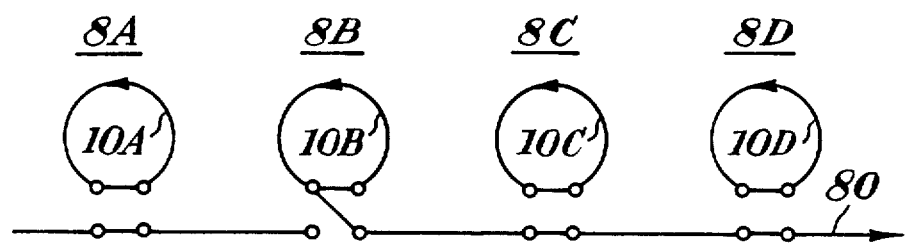

FIG. 6B shows the result of a set of commands first matching against a keyword and then setting a switch to copy at the first match only. In the example shown the first match encountered is in the second memory cell 8B. The data bits stored within loop 10B are copied to the output data chain 80 while continuing to circulate in the loop.

Figure 6C:
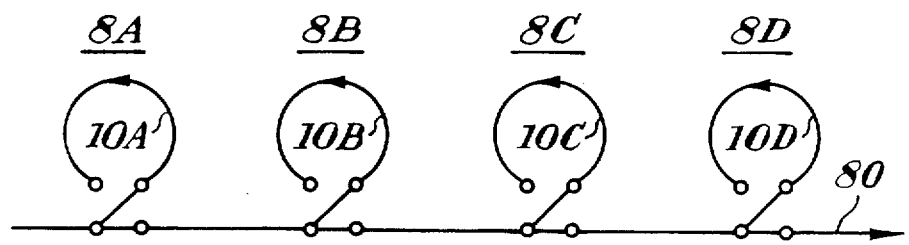

FIG. 6C shows the result of executing an overwrite operation. The switches have all been set to the overwrite mode either unconditionally or up to and including the first match, where the first match is assumed to lie to the right of the memory block 8C in the figure. This particular switch configuration is particularly useful for filling all memory blocks 8 with a predetermined data record when the system is initialized for example. The contents of each data storage loop 10 is changed to that fed in from the data chain 80.

Figure 6D:
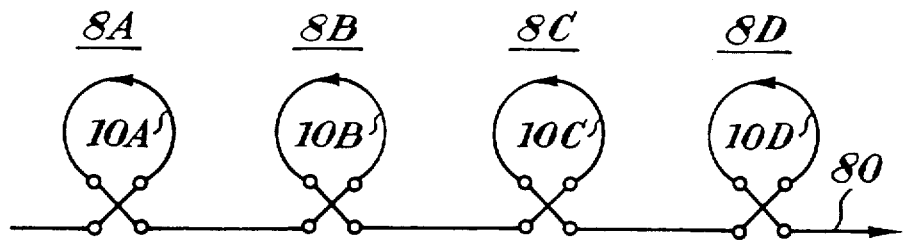

FIG. 6D shows the result of a sequence of commands where all switches are set to barrel either unconditionally or up to and including the first match position, where the first match is at or beyond the fourth memory block 8D. This switch configuration is especially useful for moving several blocks of stored data simultaneously down the set of storage loops via the data chain 80. The configuration is also used during insertion and deletion of data records.

FIGS. 7A to 7D show the manner of record insertion into the chain of memory blocks 8.

Figure 7A:
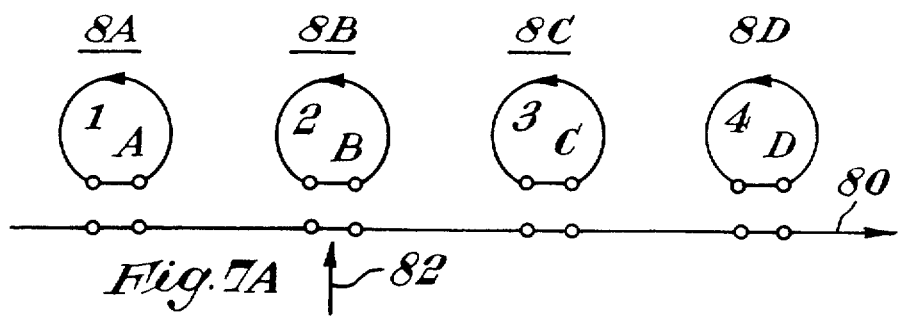
FIGS. 7A to 7D show, schematically, the sequence of data flow paths required for the insertion of a record into the chain of FIG. 4.
Figure 7B:
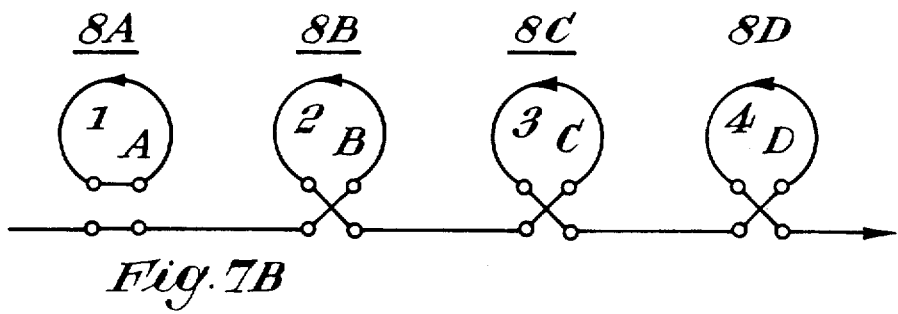

FIG. 7A shows all of the storage loops 10 recirculating with switches 16 set to loop. A comparison operation is then initiated and in the example shown, a match is assumed to be found in the second memory block 8B as indicated by the arrow 82, setting the Match flip-flop 108 at this position.

Figure 7C:
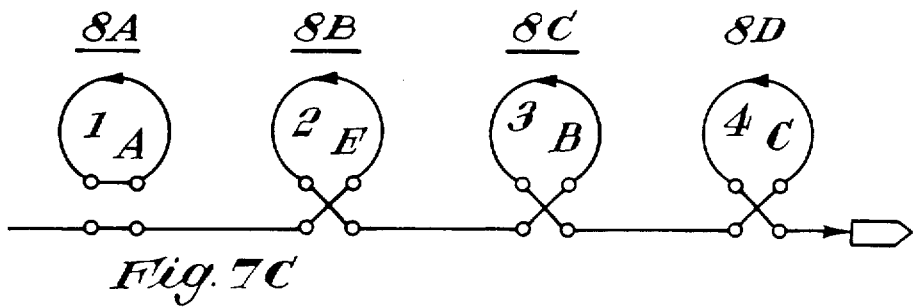
Figure 7D:
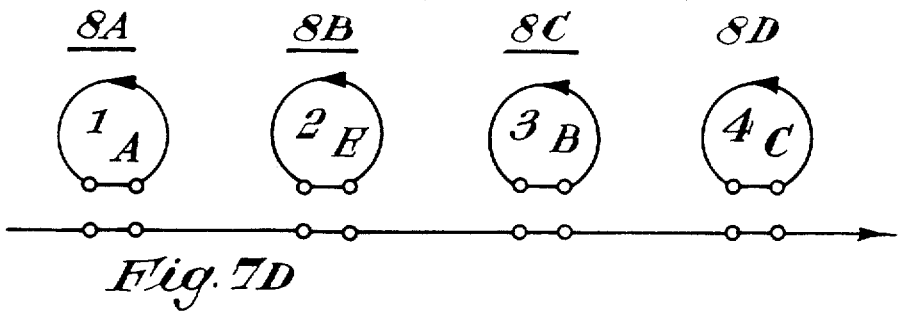

A preset operation command is then propagated with parameters of "from and including first match" and "barrel". The subsequent operate command, timed to coincide with the arrival of the first bit of each data record at the associated switch 16, then produces the configuration shown in FIG. 7B. The new data record to be inserted is entered to the data line 80. The first bit coincident with the Operate command, so that the new data record arrives at switch 16 at the time it is set to barrel. The new data record is inserted serially into the second memory block 8B, and the data record previously stored in the second block 8B is moved serially into the third memory block 8C. Similarly all data records are moved one block further down the chain. The data from the very last block in the chain is of course moved out of the memory altogether, but unless the memory has been filled to capacity, this will be a null record, and of no significance. The data movement described is shown in FIG. 7C. As the new data record is being inserted a further Preset Operation command is propagated with parameters to set all switches to loop. An operation coincident with the last bit of the data record performs this operation with the result shown in FIG. 7D. Memory block 8B contains the inserted data record.

FIGS. 8A to 8D show how a record is deleted from the chain of memory blocks 8.

Figure 8A:
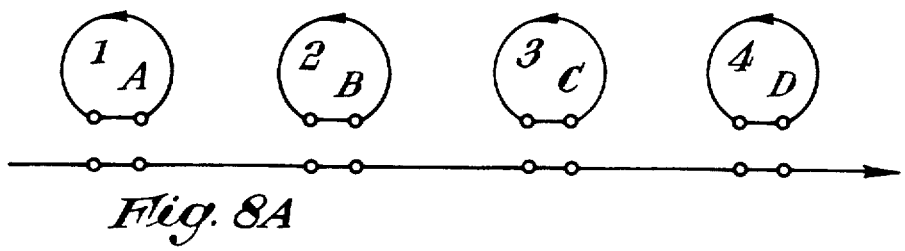
FIGS. 8A to 8D show, schematically, the sequence of data flow configurations required for the deletion of a data record from the chain of FIG. 4.

FIG. 8A shows, just as does FIG. 7A, all registers 10 and switches 16 set to loop and match being sought which, again by way of example, is assumed to occur in the second block 8B.

Figure 8B:
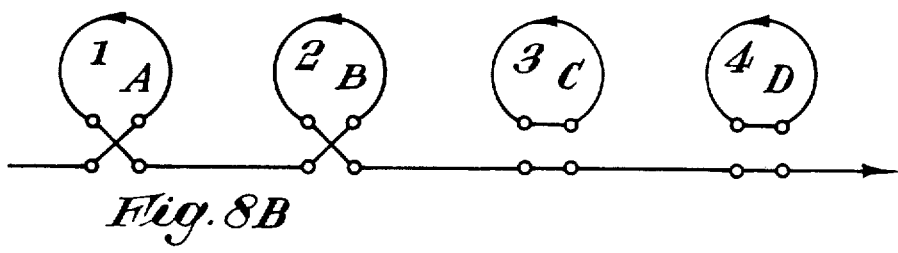

FIG. 8B shows how, as a result of a sequence of commands to set all switches to barrel at positions up to and including the first match the chain of memory blocks 8 is configured for the deletion of the record in the second block 8B.

Figure 8C:
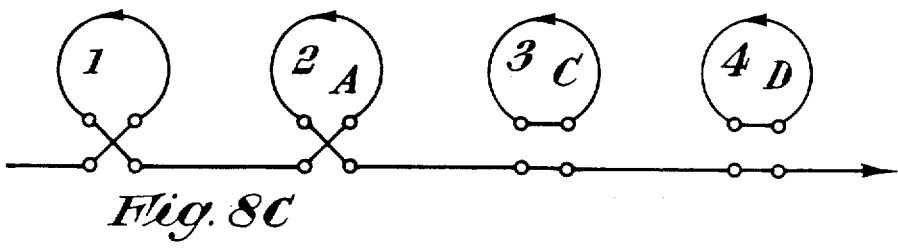

FIG. 8C shows the subsequent movement of data. All records in blocks earlier than the second block 8B are moved one place down the chain so that, for example, the record in the first block 8A moves into the second block 8B. The record initially in the second block 8B is moved onto the data chain 80 and therefrom out of the memory altogether.

Figure 8D:
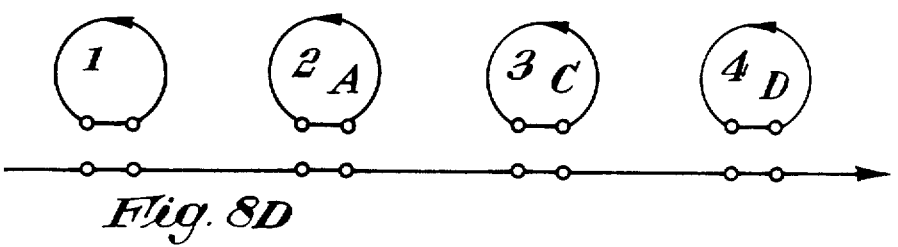

FIG. 8D shows the last configuration of the data deletion operation where all memory blocks have been subjected to an unconditional loop command. Note that after both insertion and deletion operations any set Match flip-flop 108 can be selectively reset by means of a Preset Operation command, with second parameter "reset match", followed by an Operate command. This permits further data operations using Match bits which remain set, or another keyword comparison to take place.

Those skilled in the art will be aware of other ways in which records can be moved in part, in whole, or in blocks of many contiguous records, into and out of the memory chain using the commands described. The final commands that is, the unconditional loop and reset match commands used normally to terminate both the data insertion and data deletion processes can be replaced by the first command of any operational sequence that it is desired to perform subsequent to the insertion or deletion operation.

In this first preferred embodiment the movement of data records is unidirectional resulting in the accumulation of empty storage registers or null records at the beginning of the chain whenever data records are deleted. This situation can present difficulties in the overall data management of the store and a second preferred embodiment is proposed incorporating bidirectional data movement between memory blocks 8.

FIG. 9 shows a modified memory block 8' constituting the second preferred embodiment of the present invention. The component parts of the modified block 8' are substantially the same as those of the unmodified block 8 shown in FIG. 1 with the following exceptions. The switch 16 of FIG. 1 is replaced by a more complex data steering switch 82 which receives clocked data not only from storage register 10 and data register 18 but also from a back data input line 84. The outputs of switch 82 remain the same as those of switch 16. A back data output line 86 is connected as shown in FIG. 9 from the penultimate bit of shift register 10. The control decoder 24 of FIG. 1 is replaced by a modified control decoder 88 having an expanded instruction set in the form of an additional second parameter "back transfer" for the Preset Operation Command (coded as 0ll and replacing the former "NO-OP"). Control decoder 88 also provides an additional switch control line as part of control coupling 38 in order to accommodate the increased functionality of switch 82.

FIG. 10 shows the modified memory blocks 8' coupled in a chain having been configured as part of a wafer-scale integrated circuit. Data can pass as before down the chain through data registers 18 and into storage registers 10 by appropriate manipulation of switches 82. Additionally, data can be passed in the opposite direction from one storage register 10 to the adjacent storage register 10, again by appropriate setting switch 82 although there is no chain of backward data registers analogous to data registers 18. Passage of command on the control lines 26, 28, 30 remains unidirectional.

FIGS. 11A to 11E show the various configurations of switch 82 which can be employed in the second preferred embodiment.

FIG. 11A shows the normal "loop" configuration where each data record circulates in its storage register and no connection exists between storage register 10 and data register 18.

FIGS. 11B, 11C, and 11D show the "copy", "overwrite" and "barrel" configurations which operate in the same manner as described relating to FIG. 3 in the first preferred embodiment.

FIG. 11E shows the "back transfer" configuration where the back data input line 84 is connected to the input line 12 of the storage register 10 so that data bits from the next storage register in the chain flow back and replace the existing data record in storage register 10. A straight-through connection is provided for the chain of data registers 18.

The back data output line 86 is taken from the penultimate bit of storage register 10 in order to compensate for the one-bit delay introduced on the data input line by data register 18, and, hence to maintain data record bit synchronization when the data record is transferred back to the next storage register up the chain. Incorporating a back data register chain analogous to data registers 18 and transferring records backwards for more than a single memory block distance would result in a loss of data record bit synchronization and prevent subsequent valid keyword comparisons.

Using the second preferred embodiment, record deletion is performed by matching the record to be deleted with a keyword as before, then setting all switches 82 to back transfer from and including the first match. The record to be deleted is then overwritten as all following records move one record position upstream. The deletion operation is completed normally by an appropriate sequence of commands resetting all switchs 82 to loop and resetting the Match Flip-Flop 108.

In both the first and second preferred embodiments before any use has been made of the newly configured chain of memory blocks, each block will have its switch set to the overwrite configuration and a predetermined null pattern sent into each storage register. The presence of the null pattern indicates a block where no data is actually stored. Thereafter all real data patterns are such that they exclude the null pattern. A new, empty, and as yet unused, data storage block can thereafter always be found by searching for a match on the null pattern.

It is to be realized that such a memory can become full and no empty block found. This condition can be detected by monitoring the outputs of the control lines and the data line. If no match is found, the record for insertion appears at the output of the chain rather than being put in a block and the command to set the switch at the first match will appear at the output unchanged instead of having its parameter changed to "NO-OP".

Figure 12:
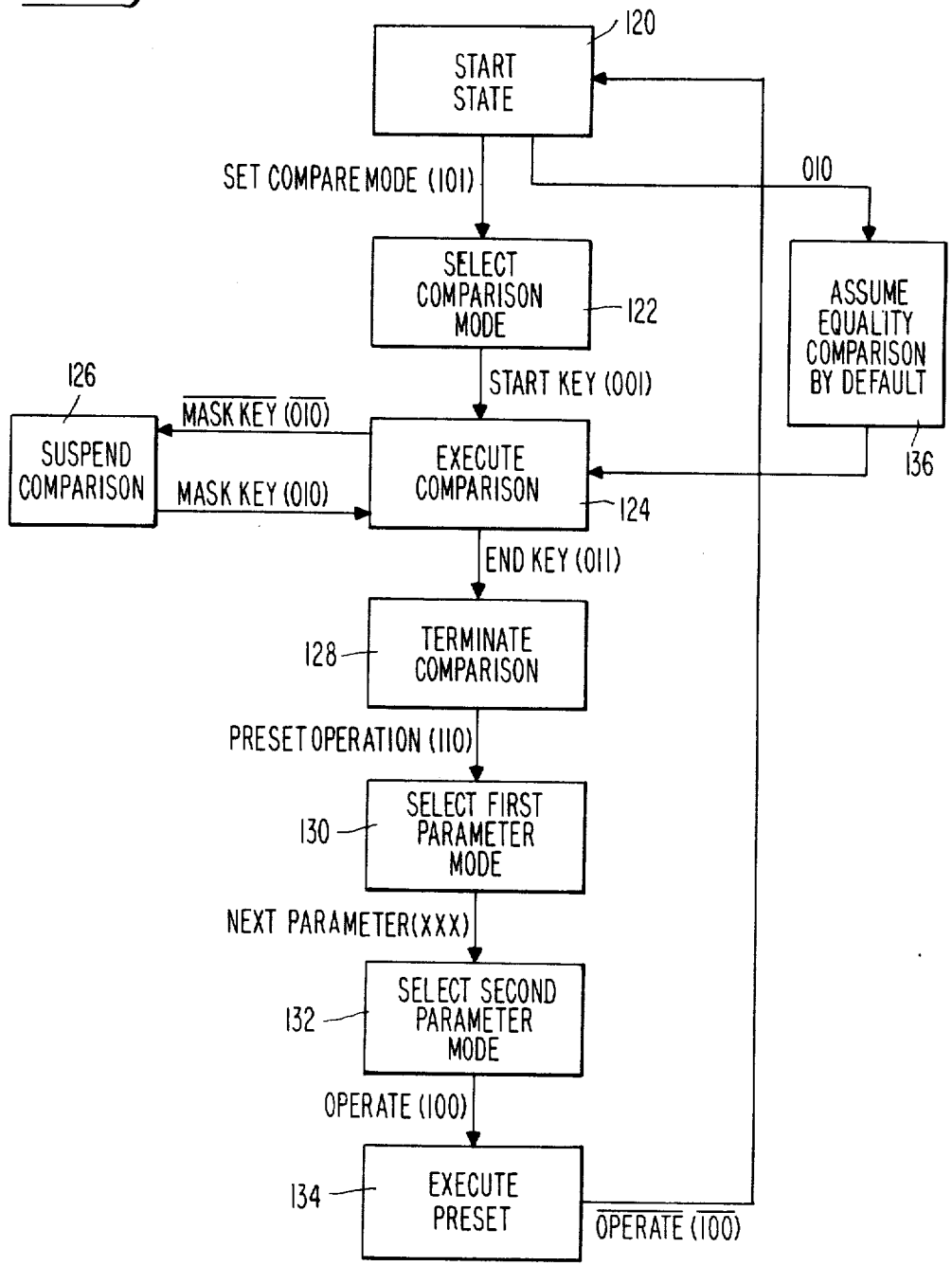

The operations of the first and second preferred embodiments require the use of an external controller, the operation and construction of which can be construed from the foregoing descriptions. FIG. 12 shows a block diagram of the state machine 102 otherwise shown in FIG. 2B. FIG. 12 is by way of a state sequence diagram where the sequence of states has been divided into levels. FIG. 12 clarifies the operation of the state machine 102 in accordance with the data from TABLE 1 and the description associated therewith.

At the first level, the state machine 102 commences with a START STATE 120. The state machine 102 monitors the condition on the first, second and third control lines 26, 28, 30 in order to change state. In FIG. 12 and the following figures, the three binary digit designations indicating a transfer between states indicate on what respective logical state of the first, second or third control lines 26, 28, 30 a state change is executed, with the convention that a Figure 1 is indicative of binary truth and a Figure 0 is indicative of binary falseness.

In the START STATE 120 the state machine 102 is ready to commence a comparison process. When the state machine 102 sees the binary word 101 on the first, second and third control lines 26, 28, 30, it moves to a second level of operation level 122 whereat the comparison mode is selected. In the second level 122 the comparison mode is selected according to TABLE 1. The state machine 102 accepts a second input from the first, second and third control lines 26, 28, 30 indicative of which kind of comparison is to be executed. The kinds of comparison available are those indicated on the output of the decoding logic 56 otherwise shown in FIG. 2A. The state machine 102 selects the manner of comparison by enabling an appropriate one of the lines 104 the AND gates shown in FIG. 2B.

Having selected the manner of comparison, the state machine 102 waits for a START KEY command before passing to a third level 124, 126 whereat the actual comparison is executed. The state machine 102 waits for the binary word 001 on the first, second and third control lines 26, 28, 30, before passing from the second level 122 to the third level 124, 126. In the third level 124, 126 the state machine 102 executes a first stage 124 where the comparison is actually executed by the raising of the line 104 to the appropriate AND gate shown in FIG. 2B. The state machine 102 monitors the signals provided on the first, second and third control lines 26, 28, 30 all of the time it is in the third level 124, 126. So long as the first, second and third control lines 26, 28, 30 have received a MASK KEY binary code, in other words the binary word 010, the state machine 102 stays at the first stage 124 of the third level 124, 126. In the event of there not being a MASK KEY word, in other words not the binary word 010, on the first, second and third control lines 26, 28, 30 the state machine 102 passes to a second stage 126 of the third level 124, 126 whereat the comparison is suspended by the dropping of the logically true signal on the appropriate one of the lines 104 to the AND gates shown in FIG. 2B.

At the second stage 126 comparison is re-enabled by the reappearance of the MASK KEY binary word, in other words the binary word 010, on the first, second and third control lines 26, 28, 30 in response whereto the state machine 102 moves from the second stage 126 back to the first stage 124 and once again raises the appropriate one of the lines 104 to the appropriate AND gate for the appropriate output 58 of the decoding logic 56 once again to be monitored.

When the first, second and third control lines 26, 28, 30 receive an END KEY control word, the binary word 011, it is indicative of the end of the matching process. The state machine 102 therefore proceeds from the third level 124 to a fourth level 128 where the comparison process is terminated.

Having reached the fourth level 128 the state machine 102 awaits a preset operation control word 110 on the first, second and third control lines 26, 28, 30 before moving to a fifth level 130. At the fifth level 130, the state machine 102 accepts the first of the two parameters defining the operation to be performed if a match has been found. The first parameter accepted, as shown in TABLE 1, is either a "NO-OP" non-operation, an "ON FIRST MATCH ONLY", "UP TO AND INCLUDING FIRST MATCH", "UNCONDITIONAL", "FROM AND INCLUDING FIRST MATCH" and "ALL MATCHES". Which of these options is selected depends entirely on the binary word on the first, second and third control lines 26, 28, 30 presented to the control state machine 102 immediately after it receives the preset operation code, binary 110.

Having selected the first parameter at the fifth level 130 the state machine 102 proceeds directly to a sixth level 132 whereat the second parameter of the present operation is selected. Dependent only upon the input word received on the first, second and third control lines 26, 28, 30 the state machine can select "NO OPERATION", "RESET MATCH", "LOOP", "COPY", "COVER-WRITE" and "BARREL". Having had the second parameter of the PRESET OPERATION selected the state machine 102 is now ready to execute its preselected one of the many combinations of PRESET OPERATION available to it should the appropriate match have been found. The state machine 102 thereafter awaits the OPERATE command, binary 100, on the first, second and third control lines 26, 28, 30 before passing to a seventh and final level 134 where the actual preselected PRESET OPERATION is executed. So long as the state machine 102 receives the OPERATE command, binary 100, it stays at the seventh level and as soon as the OPERATE command 100 no longer appears on the first, second and third control lines 26, 28, 30 the state machine 102 passes back to the first level 120 ready to assume a new set of instructions.

If, when the state machine 102 is at the first level 120, it receives the START KEY input 010 from the control word latch 100 of FIG. 2B before it receives the SET COMPARE MODE input, binary 101, an automatic entry to a default operation 136 is executed whereby entry is made to the third level 124 directly on the assumption that the comparison for equality is required.

What I claim is:

1. An integrated circuit for use in concatenating first and second memory blocks, comprising:
   a plural location data store;
   a through-passing data path for receiving a succession of data characters from said first memory block and for passing a succession of data characters to said second memory block;
   a through-passing control path for receiving a succession of control characters from said first memory block and for passing a succession of control characters to said second memory block;
   a through-passing address path for receiving a succession of key word address characters from said first memory block and for passing said succession of key word address characters to said second memory block;
   a control decoder for monitoring the contents of said control path and for providing, in response to the received succession of control characters, a control signal output;
   a data comparator for receiving said succession of key word address characters and operable, in response to said control signal output from said decoder, to compare said succession of key word address characters with the contents of a selectable succession of locations in said store and to detect a selectable one out of a plurality of magnitude relationships between said key word address characters and said contents of said succession of locations in said store and provide an indication of the magnitude relationship as an output signal; and,
   a data switch responding to said control signal from said decoder and said magnitude relationship output signal from said data comparator to switch said data between said data path and said store, along said data path or within said store.

2. A memory block according to claim 1 wherein said switch is operable to perform a range of data steering operations including:
   retention of data in said store while coupling said succession of data characters received from said first memory block as said succession of data characters passed to said second memory block;
   the storage in said store of said succession of data characters received from said first memory block while providing as said succession of data characters passed to said second memory block the previous contents of said store;
   the retention of data in said store, while ignoring said succession of characters received from said first memory block, and while providing a replica of data in said store as said succession of characters passed to said second memory block; and,
   the coupling of said succession of data characters received from said first memory block as said succession of data characters passed to said second memory block while storing said succession of received data characters and while discarding the previous contents of said store.

3. A memory block according to claim 2 wherein said control decoder comprises a control character modifier operable in response to the receipt of one or more predetermined control characters from said first memory block and in response to the output of said data comparator, to provide a modified succession of control characters for coupling to said memory block in said control path, but otherwise to provide as said succession of control characters for coupling to said second memory block in said control path the same succession of control characters as said control decoder receives from said first memory block.

4. A memory block according to claim 3 wherein said plurality of selectable magnitude relationships includes said key word address characters being equal to the stored data word selected from among the data in said store, said key word address character being less than or equal to said stored data word, said key word address character being less than said stored data word, said key word address character being equal to or greater than said stored data word, and said keyword address character being greater than said stored data word.

5. A memory block according to claim 4 wherein said store is a serial-in serial-out shift register and wherein said retention of data in said store consists in coupling the output of said shift register to the input of said shift register for data to circulate therethrough.

6. A memory block according to claim 5 wherein said data path comprises a unit delay latch between said first memory block and said data switch, said key word address path comprises a second unit delay latch between said first memory block and said comparator, and said control path comprises a third unit delay latch between said first memory block and said decoder, and wherein said register and said first, second, and third delay latches are all in receipt of a common clocking signal, said latches in response thereto transferring and maintaining at their respective output the logical state of their respective inputs and said shift register responding thereto by shifting its contents by one location between said input of said shift register and said output of said shift register.

7. A memory block according to claim 6 wherein said control decoder comprises a control state machine operable to recognise a first control character indicative of the selection of a generic command type, and thereafter operable to recognise one or more subsequent control characters operative to select one out of a plurality of manners of execution of said generic command type, said state machine inhibiting said output of said control decoder until after said recognition of said one or more subsequent control characters.

8. A memory block according to claim 7 wherein said data characters received from said first memory block are provided in the form of a stream of serial binary digits, said data characters passed to said second memory block are provided in the form of a stream of serial binary digits, said address words are received from said first memory block as a serial stream of binary digits, and passed to said second memory block as a serial stream of binary digits, and said control characters are received from said first memory block as a serial succession of plural parallel binary digit words and passed to said second memory block as a serial succession of plural, parallel binary digit words.

9. An integrated circuit for use in concatenating first and second memory blocks, comprising:
   a plural location data store;
   a through-passing data path for receiving a succession of data characters from said first memory block and for passing a succession of data characters to said second memory block;
   a through-passing control path for receiving a succession of control characters from said first memory block and for passing a succession of control characters to said second memory block;
   a through-passing address path for receiving a succession of key word address characters from said first memory block and for passing said succession of key work address characters to said second memory block;
   a control decoder for monitoring the contents of said control path and for providing, in response to the received succession of control characters, a control signal output;
   a data comparator for receiving said succession of key word address characters and operable, in response to said control signal output from said decoder, to compare said succession of key word address characters with the contents of a selectable succession of locations in said store and to detect a selectable one out of a plurality of mangitude relationships between said key word address charac-
   ters and said contents of said succession of locations in said store and provide an indication of the magnitude relationship as an output signal; and,
   a data switch responding to said control signal from said decoder and said magnitude relationship output signal from said data comparator to switch said data between said data path and said store, along said data path or within said store;
   a backward data output line for supplying the contents of said store to the backward data input line in said first memory block, as a succession of backward data output characters; and,
   a backward data input line for supplying a serial succession of backward data input characters received from the backward data output line of said second memory block to said data switch.

10. A memory block according to claim 9 wherein said switch is operable to perform a range of data steering operations including:
   retention of data in said store while coupling said succession of data characters received from said first memory block as said succession of data characters passed to said second memory block;
   the storage in said store of said succession of data characters received from said first memory block while providing as said succession of data characters passed to said second memory block the previous contents of said store;
   the retention of data in said store, while ignoring said succession of characters received from said first memory block, and while providing a replica of data in said store as said succession of characters passed to said second memory block; and,
   the coupling of said backward data input characters on said backward data input line for storing in said store while coupling said serial succession of data characters received from said first memory block as said serial succession of data characters to said second memory block and discarding those characters previously stored in said store.

11. A memory block according to claim 10 wherein said control decoder comprises a control character modifier operable in response to the receipt of one or more predetermined control characters from said first memory block and in response to the output of said data comparator, to provide a modified succession of control characters, for coupling to said memory block in said control path, but otherwise to provide as said succession of control characters for coupling to said second memory block in said control path the same succession of control characters as said control decoder receives from said first memory block.

12. A memory block according to claim 11 wherein said plurality of selectable magnitude relationships includes; said key word address character being equal to the stored data word selected from among the data in said store, said key word address character being less than or equal to said stored data word, said key word address character being less than said stored data word, said key word address character being equal to or greater than said stored data word, and said key word address character being greater than said stored data word.

13. A memory block according to claim 12 wherein said store is a serial-in serial-out shift register wherein said retention of data in said store consists in coupling the output of said shift register to the input of said shift register for data to circulate therethrough, and wherein said backward data out line has thereon a representation of the data character stored in the penultimate position of said shift register.

14. A memory block according to claim 13 wherein said data path comprises a unit delay latch between said first memory block and said data switch, said key word address path comprises a second unit delay latch between said fist memory block and said comparator, and said control path comprises a third delay latch between said first memory block and said decoder and wherein said shift register and said first, second, and third delay latches are all in receipt of common clocking signals, said latches in response thereto transferring and maintaining at their respective outputs the logical state of their respective inputs and said shift register responding thereto by shifting its contents by one location between said input of said shift register and said output of said shift register.

15. A memory block according to claim 14 wherein said control decoder comprises a control state machine operable to recognise a first control character indicative of the selection of a generic command type and is thereafter operable to recognise one or more subsequent control characters operative to select one out of a plurality of manners of execution of said generic command type, said state machine inhibiting said output of said control decoder until after said recognition of said one or more subsequent control characters.

16. A memory block according to claim 15 wherein said data characters received from said first memory block are provided in the form of a stream serial binary digits, said data characters passed to said second memory block are provided in the form of serial binary digits, said key word address words are received from said first memory block as a serial stream of binary digits and passed to said second memory block as a serial stream of binary digits, and said control characters are received from said first memory block as a serial succession of plural parallel binary digit words and passed to said second memory block as a serial succession of plural, parallel binary digit words.

* * * * *